(12) United States Patent
Rendek, Jr. et al.

(10) Patent No.: US 9,293,438 B2
(45) Date of Patent: Mar. 22, 2016

(54) METHOD FOR MAKING ELECTRONIC DEVICE WITH COVER LAYER WITH OPENINGS AND RELATED DEVICES

(71) Applicant: HARRIS CORPORATION, Melbourne, FL (US)

(72) Inventors: Louis Joseph Rendek, Jr., West Melbourne, FL (US); Casey Philip Rodriguez, Indialantic, FL (US); Travis L. Kerby, Indian Harbour Beach, FL (US); Michael Raymond Weatherspoon, West Melbourne, FL (US)

(73) Assignee: HARRIS CORPORATION, Melbourne, FL (US)

( * ) Notice: Subject to any disclaimer, the term of this patent is extended or adjusted under 35 U.S.C. 154(b) by 234 days.

(21) Appl. No.: 13/934,465

(22) Filed: Jul. 3, 2013

(65) Prior Publication Data
US 2015/0009644 A1    Jan. 8, 2015

(51) Int. Cl.
*H01L 23/00*    (2006.01)
*H05K 3/28*    (2006.01)
(Continued)

(52) U.S. Cl.
CPC ............... *H01L 24/83* (2013.01); *H01L 24/29* (2013.01); *H01L 24/92* (2013.01); *H05K 3/287* (2013.01); *H01L 21/4846* (2013.01); *H01L 23/4985* (2013.01); *H01L 23/49838* (2013.01); *H01L 23/49894* (2013.01); *H01L 24/13* (2013.01); *H01L 24/81* (2013.01); *H01L 2224/1134* (2013.01); *H01L 2224/131* (2013.01); *H01L 2224/133* (2013.01); *H01L 2224/1329* (2013.01); *H01L 2224/13082* (2013.01); *H01L 2224/13144* (2013.01); *H01L 2224/13147* (2013.01); *H01L 2224/13294* (2013.01);
(Continued)

(58) Field of Classification Search
CPC ...................................................... H05K 1/181
See application file for complete search history.

(56) References Cited

U.S. PATENT DOCUMENTS

| | | | |
|---|---|---|---|
| 5,534,094 A | 7/1996 | Arjavalingam et al. | |
| 6,121,689 A * | 9/2000 | Capote ................. | B23K 35/025 257/773 |

(Continued)

FOREIGN PATENT DOCUMENTS

| | | |
|---|---|---|
| EP | 1215948 A2 | 6/2002 |
| EP | 2237652 A1 | 12/2010 |

(Continued)

OTHER PUBLICATIONS

Narayan et al., "Thin Film Transfer Process for Low Cost MCM's," IEEE/CHMT Int'l Electronics Manufacturing Technology Symposium, 1993, pp. 373-380.

(Continued)

*Primary Examiner* — Mark Tornow
(74) *Attorney, Agent, or Firm* — Allen, Dyer, Doppelt, Milbrath & Gilchrist, P.A.

(57) ABSTRACT

A method of making an electronic device includes forming an electrically conductive pattern on a substrate, forming a cover layer on the substrate and the electrically conductive pattern, and forming openings in the cover layer and being aligned with the electrically conductive pattern. The method also includes positioning an IC on the cover layer so that bond pads of the IC are aligned with the openings, and heating under pressure the cover layer to both mechanically secure and electrically interconnect the IC.

14 Claims, 3 Drawing Sheets

(51) Int. Cl.
    *H01L 23/498* (2006.01)
    *H01L 21/48* (2006.01)
    *H05K 3/34* (2006.01)

(52) U.S. Cl.
    CPC .......... *H01L 2224/29011* (2013.01); *H01L 2224/2919* (2013.01); *H01L 2224/73204* (2013.01); *H01L 2224/75251* (2013.01); *H01L 2224/75252* (2013.01); *H01L 2224/8112* (2013.01); *H01L 2224/81191* (2013.01); *H01L 2224/81193* (2013.01); *H01L 2224/8388* (2013.01); *H01L 2224/83192* (2013.01); *H01L 2224/83203* (2013.01); *H01L 2224/83204* (2013.01); *H01L 2224/83359* (2013.01); *H01L 2224/9211* (2013.01); *H01L 2924/12042* (2013.01); *H01L 2924/381* (2013.01); *H05K 3/3436* (2013.01); *H05K 3/3452* (2013.01); *H05K 3/3484* (2013.01); *H05K 2201/0141* (2013.01)

(56) References Cited

U.S. PATENT DOCUMENTS

| | | | |
|---|---|---|---|
| 6,183,588 B1 | 2/2001 | Kelly et al. | |
| 6,372,992 B1 | 4/2002 | Yang | |
| 6,600,234 B2 * | 7/2003 | Kuwabara | H01L 21/56 257/737 |
| 6,627,844 B2 * | 9/2003 | Liu et al. | 219/121.71 |
| 6,998,327 B2 | 2/2006 | Danielson et al. | |
| 7,226,821 B2 | 6/2007 | Primavera et al. | |
| 7,343,675 B2 | 3/2008 | Smith et al. | |
| 7,485,489 B2 | 2/2009 | Bjorbell | |
| 7,497,911 B2 | 3/2009 | Primavera et al. | |
| 7,750,469 B2 * | 7/2010 | Cho et al. | 257/738 |
| 7,820,233 B2 | 10/2010 | Chen et al. | |
| 8,011,589 B2 | 9/2011 | Kato et al. | |
| 8,013,688 B2 | 9/2011 | White et al. | |
| 8,072,768 B2 | 12/2011 | Ockenfuss et al. | |
| 8,129,841 B2 * | 3/2012 | Pendse | H01L 21/563 257/737 |
| 8,161,633 B2 | 4/2012 | Shacklette et al. | |
| 8,173,490 B2 | 5/2012 | Eckhardt et al. | |
| 2001/0017414 A1 | 8/2001 | Gilleo | |
| 2002/0180029 A1 | 12/2002 | Higashitani et al. | |
| 2005/0112798 A1 | 5/2005 | Bjorbell | |
| 2006/0068576 A1 | 3/2006 | Burdick, Jr. et al. | |
| 2007/0025092 A1 | 2/2007 | Lee et al. | |
| 2008/0075836 A1 | 3/2008 | Chen et al. | |
| 2008/0139013 A1 | 6/2008 | Tomura et al. | |
| 2008/0178463 A1 | 7/2008 | Okubora | |
| 2008/0179724 A1 | 7/2008 | Gregory | |
| 2008/0244898 A1 | 10/2008 | Shacklette et al. | |
| 2008/0277150 A1 | 11/2008 | Takashima et al. | |
| 2009/0084595 A1 | 4/2009 | Park et al. | |
| 2009/0250253 A1 * | 10/2009 | Park et al. | 174/258 |
| 2009/0289360 A1 * | 11/2009 | Takahashi | H01L 23/49811 257/737 |
| 2010/0066683 A1 | 3/2010 | Chang et al. | |
| 2012/0038593 A1 | 2/2012 | Ronka et al. | |
| 2012/0098129 A1 | 4/2012 | Reed et al. | |
| 2012/0168948 A1 | 7/2012 | Rathburn | |
| 2012/0182701 A1 | 7/2012 | Weatherspoon et al. | |
| 2012/0182702 A1 | 7/2012 | Rendek, Jr. et al. | |
| 2014/0217618 A1 | 8/2014 | King et al. | |

FOREIGN PATENT DOCUMENTS

| | | |
|---|---|---|
| JP | 2002141370 | 5/2002 |
| JP | 2003124251 | 4/2003 |
| JP | 2005203646 | 7/2005 |

OTHER PUBLICATIONS

Zhang et al., "Flexible Electronics: Thin Silicon Die on Flexible Substrates," IEEE Transactions on Electronics Packaging Manufacturing, vol. 32, No. 4, Oct. 2009, pp. 291-300.

Culbertson, "A New Laminate Material for High Performance PCBs: Liquid Crystal Polymer Copper Clad Films," IEEE Xplore, Downloaded Aug. 12, 2010, pp. 520-523.

Zhang et al., "The Processing and Assembly of Liquid Crystalline Polymer Printed Circuits," 2011, 9 pages.

\* cited by examiner

METHOD FOR MAKING ELECTRONIC DEVICE WITH COVER LAYER WITH OPENINGS AND RELATED DEVICES

FIELD OF THE INVENTION

The present invention relates to the field of electronic devices, and, more particularly, to liquid crystal polymer packaging of electronic devices and related methods.

BACKGROUND OF THE INVENTION

As semiconductor and integrated circuit (IC) technology has advanced, there has been a trend toward high-functionality IC components with numerous input and output (IO)) pins, together with a demand for reduced chip size, weight, and power consumption. Consequently, as (IO) density increases, the pin size and spacing between pins must decrease.

To match the pin spacing of these ICs, there is a demand for printed circuit boards which will therefore have small, closely arranged solder pads. However, the reduction of the spacing between IC pins is currently happening at a greater rate than the corresponding solder pads on printed circuit boards. Consequently, there may be an interconnection technology gap for some modern devices.

To make such devices function, printed circuit boards may have extra routing layers to handle the pins of the ICs, or utilize fan-out packaging. This results in the package size of the IC being larger than the IC itself, which may limit system miniaturization. In addition to the desire for miniaturized devices, it is also desirable in some cases to construct these devices from a flexible, and not rigid, substrate.

One material now being used as a substrate from which to construct thin and flexible printed circuit boards is liquid crystal polymer (LCP). The molecules in LCPs have rigid, rod-like shapes, and maintain a crystalline order when in a liquid phase or when heated and melted. T. Zhang, W. Johnson, B. Farrell, and M. St. Lawrence, in their paper "The processing and assembly of liquid crystalline polymer printed circuits," 2002 Int. Symposium on Microelectronics, 2002 discloses the construction of a printed circuit board using LCP as a substrate. A photoresist is first applied to a copper clad laminate, exposed, and developed to define a desired circuit pattern. The actual circuit is then defined by etching the exposed copper away. Holes or vias are created in the substrate via mechanical drilling. A desmearing step is then performed to remove debris from the vias or holes, thereby preparing the LCP material for metal deposition. A metallization step is next performed, and a typical solder mask is applied to the LCP substrate. Solder is then applied through the typical solder mask to complete the construction of the LCP printed circuit board.

While this design does allow for the creation of thin, flexible printed circuit boards, it still suffers from the same drawbacks as described above with respect to the attachment of ICs with closely spaced pins thereto. As such, additional methods of connecting ICs to printed circuit boards are needed.

The above described packaging issues may also be present when mounting a flip chip IC onto the printed circuit board. As with wire bond ICs, the board level interconnect for a flip chip device may comprise fan-out connectors due to limited feature resolution. Moreover, in these applications, under fill adhesive is formed under the flip chip IC to provide mechanical and environmental protection of the IC. Regardless of whether flip chip or wire bond ICs are used, as the packaging becomes more miniaturized, there is greater difficulty in controlling the placement and curing of the adhesive. For example, the adhesive may flow into sensitive areas, such as lithographically-defined solder mask openings and interconnect pads.

Moreover, with reduced pin sizes in state-of-the-art ICs comes a reduced standoff height between the flip chip ICs and the substrate. This may render capillary under fill techniques more difficult. One approach to manufacturing flip chip substrates is disclosed in U.S. Pat. No. 7,820,233 to Chen et al. The method comprises forming a patterned resist layer on a surface of a carrier, forming sequentially a first metal layer, an etching stop layer, and a second metal layer, removing the resist layer, and forming a patterned first solder mask, and then forming at least one first circuit build up structure thereon. The method also includes forming a patterned second solder mask on the circuit build up structure, removing the carrier, the first metal layer, and the etching-stop layer, and forming solder bumps on both sides of the circuit build up structure. A drawback to such an approach may be increased costs due to the high number of steps in the manufacturing process.

SUMMARY OF THE INVENTION

In view of the foregoing background, it is therefore an object of the present invention to provide a method for making an electronic device having reduced size connector pads.

This and other objects, features, and advantages in accordance with the present invention are provided by a method of making an electronic device comprising forming an electrically conductive pattern on a substrate (e.g. LOP), forming a cover layer (e.g. LCP) on the substrate and the electrically conductive pattern, and forming a plurality of openings in the cover layer and being aligned with the electrically conductive pattern. The method also includes positioning an IC on the cover layer so that bond pads of the IC are aligned with the plurality of openings, and heating under pressure the cover layer to both mechanically secure and electrically interconnect the IC. Advantageously, the electronic device may be formed with high resolution and reduced stand-off height bond pad connections.

Another aspect is directed to an electronic device comprising a substrate, an electrically conductive pattern on the substrate and comprising a plurality of traces, and a cover layer on the substrate and the electrically conductive pattern. The cover layer has a plurality of openings therein aligned with the electrically conductive pattern, each opening having a respective width less than that of a respective trace in the electrically conductive pattern. The electronic device comprises an IC on the cover layer having a plurality of bond pads on a surface thereof.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
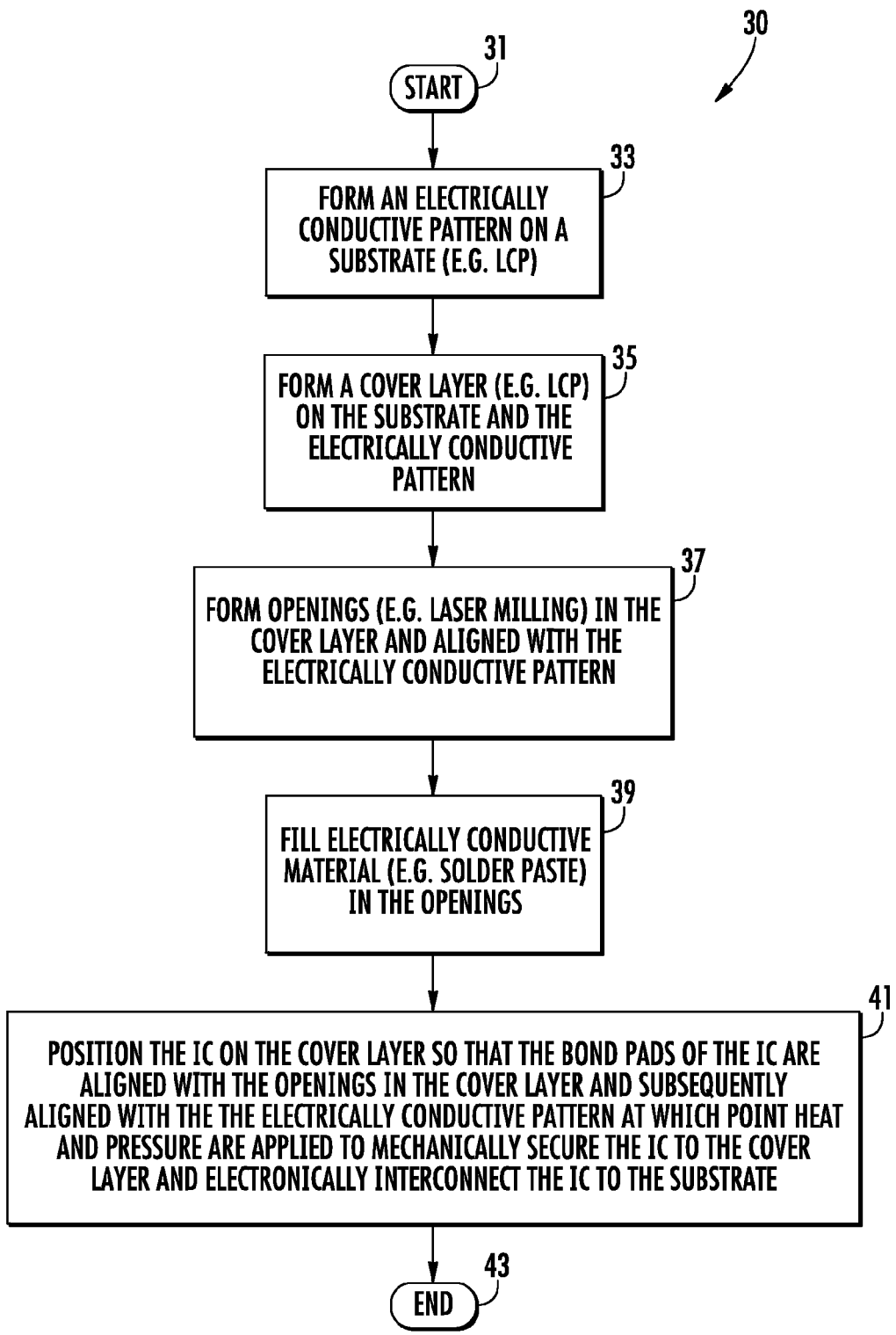
FIG. 1 is a flowchart of a method of making an electronic device, according to the present invention.
Figure 2A:
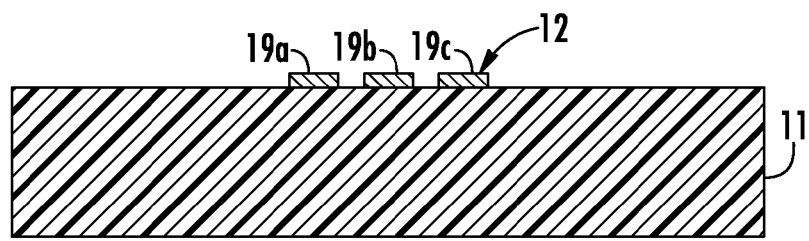
FIGS. 2A-2D are schematic diagrams of cross-sectional views of the steps in the method of FIG. 1 along line 2-2.
Figure 2B:
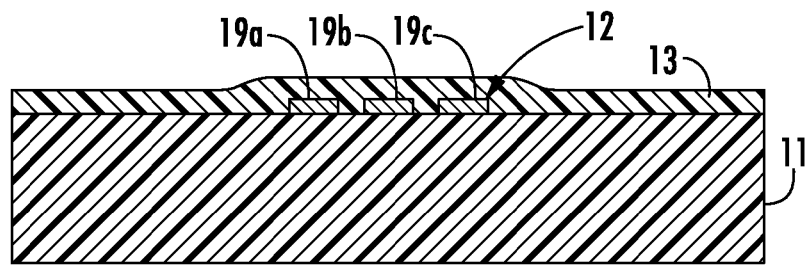
Figure 2C:
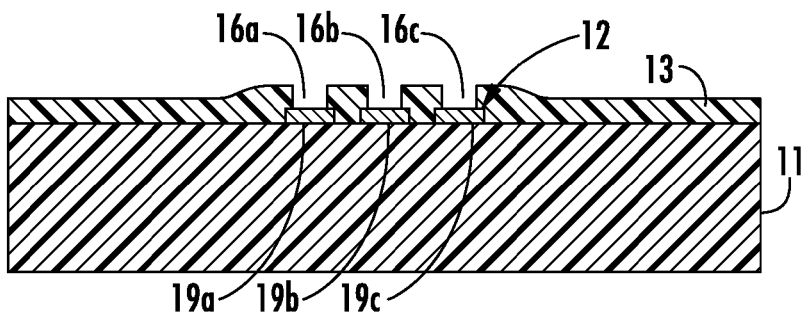
Figure 2D:
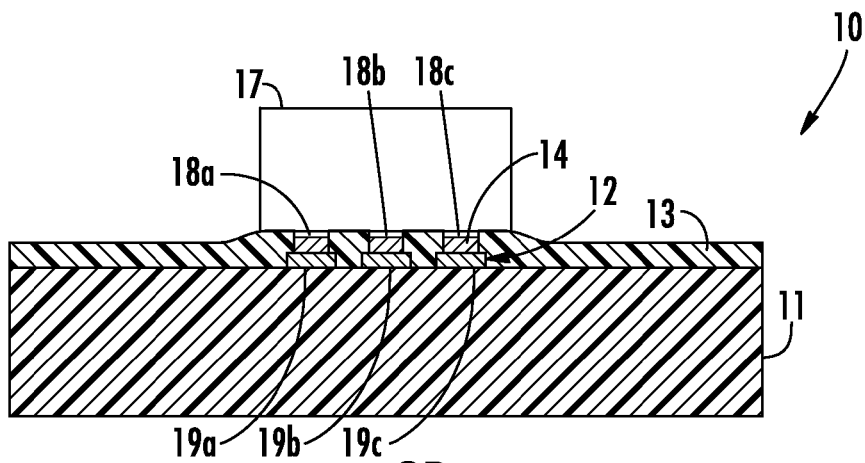

Referring now to FIGS. 1-2D and to a flowchart 30, a method of making an electronic device 10 according to the present invention is now described. (Block 31). The method comprises forming an electrically conductive pattern 12 on a substrate 11 (Block 33). For example, the electrically conductive pattern 12 may comprise copper or aluminum. Also, the substrate 31 may comprise a rigid semiconductor substrate (e.g. silicon, Gallium arsenide, ceramic, glass) or an organic rigid or flexible substrate (e.g. LCP, resin glass laminate, polyimide, polytetrafluoroethylene (PTFE)). This step can also include forming the electrically conductive pattern 12 to include a medial pad (not shown).

The method also includes forming a cover layer (coverlay) 13 on the substrate 11 and the electrically conductive pattern 12 (Block 35). For example, the forming of the cover layer 13 may comprise forming an LCP cover layer. In some embodiments, including the LCP cover layer embodiment, the method includes the step of laminating the cover layer 13 onto the substrate 11 by applying heat and pressure.

The method also includes forming a plurality of openings 16a-16c in the cover layer 13 (Block 37). The forming of the plurality of openings 16a-16c in the cover layer 13 may comprise laser milling the plurality of openings. As perhaps best seen in FIG. 2C, the openings 16a-16c are aligned with the conductive traces 19a-19c of the electrically conductive pattern 12.

In one embodiment, the openings 16a-16c are formed using the laser milling disclosure of U.S. Patent Application Publication No. 2012/0182702, published Jul. 19, 2012, also assigned to the present application's assignee, the contents of which are hereby incorporated by reference in their entirety. Advantageously, the method leverages the enhanced resolution of the laser milling to create openings 16a-16c in the cover layer 13. In particular, the openings 16a-16c may be formed as small as 0.001-0.002 inches (25.4-50.8 microns). For example, the laser milling step may use a picosecond pulsed laser drill. Moreover, the positional accuracy of the openings 16a-16c may be achieved in the 0.0005-0.001 inches range (12.7-25.4 microns). Advantageously, the increased positional accuracy may allow for reduction in aperture size, which in turn allows for simplified flip chip component attach in addition to reduction in risk of pad interconnect bridging.

The forming of the plurality of openings 16a-16c in the cover layer 13 comprises forming the plurality of openings to each have a width less than a respective width of an adjacent portion (i.e. traces 19a-19c) of the electrically conductive pattern 12. For example, the openings 16a-16c may have respective width values 25 microns less than that of the traces 19a-19c. Advantageously, this approach may reduce the likelihood of bridging adjacent interconnect pads.

The method further comprises filling electrically conductive material 14 in the plurality of openings 16a-16c before the positioning of the IC 17 (Block 39). Limitations in the size of the openings 16a-16c created in the cover layer 13 are defined not by the laser, but by the ability to insert electrically conductive fill material 14 into high aspect ratio openings. The electrically conductive material 14 may comprise a solder paste or, alternatively, conductive epoxy, gold stud bumps, or solder capped copper pillars.

The method also includes positioning an IC 17 on the cover layer 13 so that bond pads 18a-18c of the IC are aligned with the plurality of openings 16a-16c (Blocks 41, 43). The IC 17 may comprise any number of devices, such as an optical sensor, microcontroller, field-programmable gate array (FPGA), radio frequency monolithic microwave integrated circuit (RF MMIC), voltage regulator, analog to digital converters, etc.

As perhaps best seen in FIGS. 2C-2D, the forming of the cover layer 13 comprises forming the cover layer to have a greater thickness adjacent the electrically conductive pattern 12. The cover layer 13 has a greater thickness adjacent the electrically conductive pattern 12 so that an upper surface thereof contacts and seals against an underside of the IC 17.

In fact, the aforementioned medial pad of the electrically conductive pattern 12 provides that the cover layer 13 will have a consistent thickness, thereby achieving solid mechanical connection to the underside of the IC 17. The method includes heating under pressure the cover layer 13 to both mechanically secure and electrically interconnect the IC 17. More specifically, the method may include heating the substrate 11, which in turn heats the cover layer 13. The heating may also include heating the IC 17 through a flip chip bonding head, which in turn heats the cover layer 13.

In particular, the method may include using a flip chip bonding head tool to locally heat the cover layer 13, in particular, the increased thickness portion thereof, and attaching the IC 17 to the cover layer. The positioning of the IC 17 would comprise a simple snap-in-place technique (e.g. using pick and place machine). Depending on the dimensions of the bond pads 18a-18c of the IC 17, the increased thickness of the cover layer 13 can be matched to provide a proper and secure mechanical connection.

Advantageously, the cover layer 13 fulfills the requirements of under fill material in typical devices, bonding with the underside of the IC 17. This cover layer 13 provides a thin under fill that reduces the overall height of the electronic device 10 yet removes the need for dams and high accuracy capillary action encapsulation materials of existing approaches.

Another aspect is directed to an electronic device 10 comprising a substrate 11, an electrically conductive pattern 12 on the substrate and comprising a plurality of traces 19a-19c, and a cover layer 13 on the substrate and the electrically conductive pattern. The cover layer 13 has a plurality of openings 16a-16c therein aligned with the electrically conductive pattern 12, each opening having a respective width less than that of a respective trace in the electrically conductive pattern. The electronic device 10 comprises an IC 17 on the cover layer 13 having a plurality of bond pads 18a-18c on a surface thereof.

Figure 3:
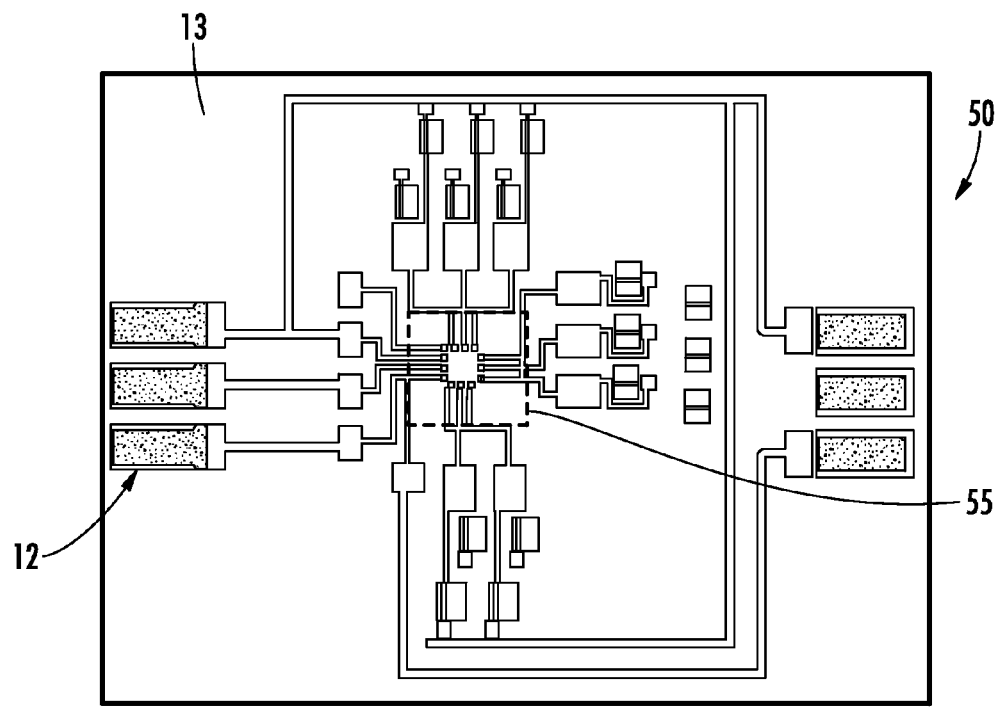
FIG. 3 is a top plan view of an example embodiment of the substrate without the IC.
Figure 4:
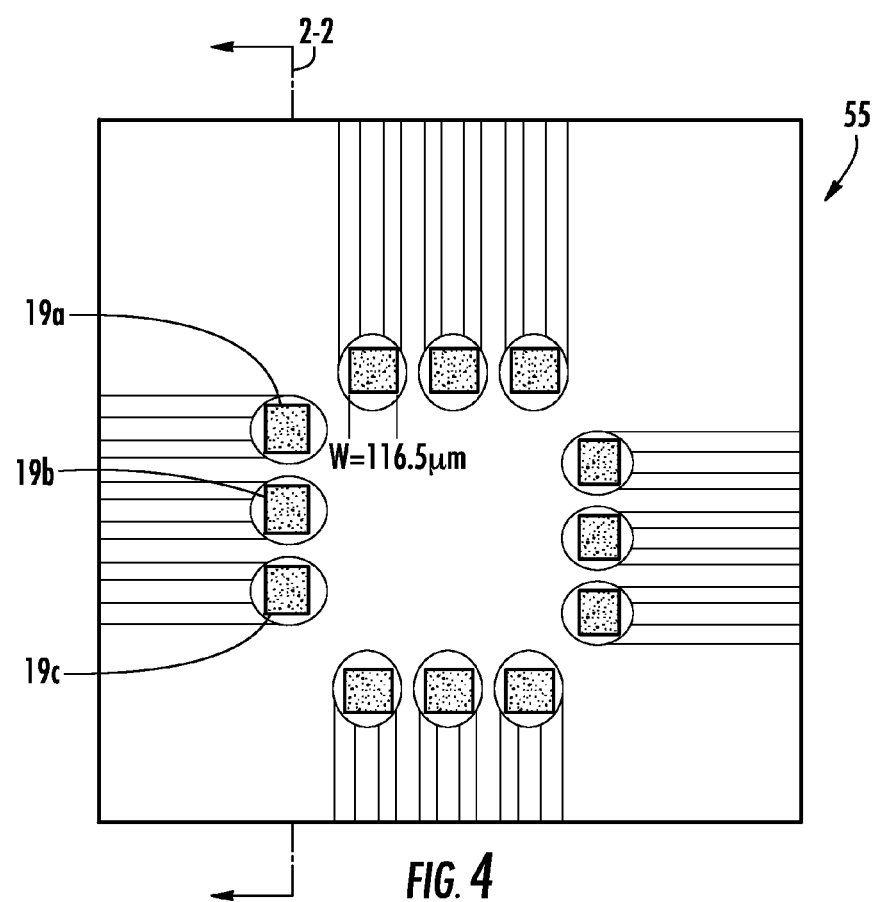
FIG. 4 is an enlarged portion of the substrate from FIG. 3.

Referring now additionally to FIGS. 3-4, an image 50 of an example embodiment of the electronic device 10 illustratively includes the electrically conductive pattern 12 having a plurality of connector pads for coupling other electronic equipment (at the lateral edge of the substrate 11). As perhaps best seen in the enlarged image portion 55, the electrically conductive pattern 12 includes traces 19a-19c that define IC bonding points. Advantageously, by leveraging the resolution of the aforementioned laser milling technique, the contacts have the noted width of 116.5 μm.

The method disclosed herein provides an approach to several technical issues. In particular, as the desire for miniature electronics continues to drive the reduction in size of active and passive components, including flip chip, surface mount (SMT) and ball/land grid array package devices (BGA, LGA, etc.), the miniaturization of these components may present a challenge in their mounting to the printed circuit board (PCB). This is due to a reduction in pad size and pitch between pads, requiring expensive equipment for precise placement of components. Also, the solder mask and cover layer capabilities in the PCB industry currently may not support snap-in-place mounting of flip chip components, typically leaving open areas between pads that present numerous challenges during the fabrication process.

Furthermore, the method disclosed herein includes several additional advantages. The generation of the openings 16a-16c in the cover layer 13 by laser milling may remove the requirement for the typical imaging step, which yields a high level of aperture positional accuracy and allows for reduction in aperture size. Flip chip components with gold stud bumps or conventional controlled collapse chip connection (C4) bumps can easily be aligned and snapped in place, without the use of expensive alignment equipment. This technique may provide flexibility in the interconnect approach, allowing for conductive adhesives and conventional solders. This reduction in opening 16a-16c size in turn allows for protection of much more densely populated substrates with higher reliability.

Moreover, the flexibility of individual LCP film layers and their stack-ability may provide opportunity for numerous stud bump heights while still maintaining contact between underside of die and top of cover layer 13. LCP materials, when laminated, form a near hermetic seal, protecting underlying traces 19a-19c and pads from oxidation when in a non-ideal working environment.

Also, LCP possesses a very high tensile strength for such a thin film, which may provide greater resistance to abrasion and damage than conventional solder mask materials (especially liquid photoimageable solder mask). In embodiments where the cover layer 13 comprises LCP, it is electrically matched (dielectric constant, loss tangent, etc.) to the underlying PCB substrate 11 (when using LCP substrate or conventional Flex Kapton). The LCP cover layer 13 is coefficient of thermal expansion (CTE) matched to conventional PCB materials. The LCP cover layer 13 may easily cover and protect underlying via holes, something that may be difficult when using state-of-the-art liquid photoimageable solder mask, and the LCP cover layer may provide better electrical isolation than conventional solder mask (typical solder mask has to meet IPC-SM-840C at 500V/mil minimum, LCP is 3500V/mil).

Other features relating to electronic devices are disclosed in co-pending application: titled "METHOD FOR MAKING ELECTRONIC DEVICE WITH LIQUID CRYSTAL POLYMER AND RELATED DEVICES," U.S. Pat. No. 8,877,558 issued Nov. 4, 2014, incorporated herein by reference in its entirety.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A method of making an electronic device comprising:
   forming an electrically conductive pattern on an upper surface of a substrate;
   forming a cover layer on the substrate and the electrically conductive pattern, the cover layer having a lower surface in direct contact with the upper surface of the substrate, and an upper surface;
   forming a plurality of openings in the cover layer aligned with the electrically conductive pattern;
   positioning an integrated circuit (IC) on the cover layer so that bond pads of the IC are aligned with the plurality of openings and so that a lower surface of the IC is in direct contact with the upper surface of the cover layer; and
   heating under pressure the cover layer to both mechanically secure and electrically interconnect the IC.

2. The method of claim 1 wherein the forming of the cover layer comprises forming a liquid crystal polymer (LOP) cover layer.

3. The method of claim 1 wherein the forming of the plurality of openings in the cover layer comprises laser milling the plurality of openings.

4. The method of claim 1 wherein the forming of the plurality of openings in the cover layer comprises forming the plurality of openings to each have a width less than a respective width of an adjacent portion of the electrically conductive pattern.

5. The method of claim 1 wherein the forming of the cover layer comprises forming the cover layer to have a greater thickness adjacent the electrically conductive pattern than in other portions of the cover layer.

6. The method of claim 1 further comprising filling electrically conductive material in the plurality of openings before the positioning of the IC.

7. The method of claim 6 wherein the filling of the electrically conductive material comprises using at least one of solder paste, conductive epoxy, a gold stud bump, and a solder capped copper pillar.

8. The method of claim 1 wherein the forming of the substrate comprises forming an LCP layer.

9. A method of making an electronic device comprising:
   forming an electrically conductive pattern on an upper surface of a substrate;
   forming a liquid crystal polymer (LCP) cover layer on the substrate and the electrically conductive pattern, the LCP cover layer having a lower surface in direct contact with the upper surface of the substrate, and an upper surface;
   laminating the LCP cover layer onto the substrate and the electrically conductive pattern;
   forming a plurality of openings in the LCP cover layer aligned with the electrically conductive pattern;
   positioning an integrated circuit (IC) on the LCP cover layer so that bond pads of the IC are aligned with the plurality of openings and so that a lower surface of the IC is in direct contact with the upper surface of the LCP cover layer; and
   heating under pressure the LCP cover layer to both mechanically secure and electrically interconnect the IC.

10. The method of claim 9 wherein the forming of the plurality of openings in the LCP cover layer comprises laser milling the plurality of openings.

11. The method of claim 9 wherein the forming of the plurality of openings in the LCP cover layer comprises forming the plurality of openings to each have a width less than a respective width of an adjacent portion of the electrically conductive pattern.

12. The method of claim 9 wherein the forming of the LCP cover layer comprises forming the LCP cover layer to have a greater thickness adjacent the electrically conductive pattern than in other portions of the LCP cover layer.

13. The method of claim 9 further comprising filling electrically conductive material in the plurality of openings before the positioning of the IC.

14. The method of claim 13 wherein the filling of the electrically conductive material comprises using at least one of solder paste, conductive epoxy, a gold stud bump, and a solder capped copper pillar.

\* \* \* \* \*